US011227995B2

(12) United States Patent
Cui et al.

(10) Patent No.: US 11,227,995 B2
(45) Date of Patent: Jan. 18, 2022

(54) SI2TE3 RESISTIVE MEMORY

(71) Applicants: Jingbiao Cui, Collierville, TN (US); Keyue Wu, Lu'an (CN); Jiyang Chen, Cordova, TN (US); Xiao Shen, Bartlett, TN (US)

(72) Inventors: Jingbiao Cui, Collierville, TN (US); Keyue Wu, Lu'an (CN); Jiyang Chen, Cordova, TN (US); Xiao Shen, Bartlett, TN (US)

(*) Notice: Subject to any disclaimer, the term of this patent is extended or adjusted under 35 U.S.C. 154(b) by 0 days.

(21) Appl. No.: 16/657,851

(22) Filed: Oct. 18, 2019

(65) Prior Publication Data
US 2020/0127198 A1 Apr. 23, 2020

Related U.S. Application Data

(60) Provisional application No. 62/747,157, filed on Oct. 18, 2018.

(51) Int. Cl.
H01L 45/00 (2006.01)
(52) U.S. Cl.
CPC ........ *H01L 45/144* (2013.01); *H01L 45/1616* (2013.01)
(58) Field of Classification Search
CPC .............. H01L 45/065; H01L 45/1233; H01L 45/1616; H01L 45/1253; H01L 45/144
See application file for complete search history.

(56) References Cited

U.S. PATENT DOCUMENTS

| 8,828,788 B2 * | 9/2014 | Erbetta | H01L 45/144 438/98 |
| 2008/0232160 A1 | 9/2008 | Gopalakrishnan | |
| 2011/0278531 A1 * | 11/2011 | Erbetta | H01L 45/16 257/4 |

OTHER PUBLICATIONS

Wu et al., "Structure and photoluminescence study of silicon based two-dimensional Si2Te 3 nanostructures", 2017, Journal of Applied Physics, vol. 122 075701, pp. 1-8, published Aug. 17, 2017 (Year: 2017).*
Keuleyan et al., "A Silicon-Based Two-Dimensional Chalcogenide: Growth of Si2Te3 Nanoribbons and Nanoplates", 2015. Nano letters, American Chemical Society, vol. 15, pp. 2285-2290, published Mar. 12, 2015 (Year: 2015).*
International Search Report and Written Opinion, PCT/US19/57065, CUI (international filing date Oct. 18, 2019).

(Continued)

Primary Examiner — Nikolay K Yushin
(74) Attorney, Agent, or Firm — Wayne Edward Ramage; Baker Donelson

(57) ABSTRACT

A ReRAM device manufactured using 2-D $Si_2Te_3$ (silicon telluride) nanowires or nanoplates. The $Si_2Te_3$ nanowires exhibit a unique reversible resistance switching behavior driven by an applied electrical potential, which leads to switching of the NWs from a high-resistance state (HRS) to a low-resistance state (LRS). This switched LRS is highly stable unless the opposite potential is applied to switch the resistance back. This provides a new class of resistive switching based on semiconductor rather than dielectric materials. In several embodiments, the polarity of the initially applied potential along the $Si_2Te_3$ nanowires defines the switch "on" and "off" directions, which become permanent once set.

9 Claims, 15 Drawing Sheets

(56) References Cited

OTHER PUBLICATIONS

Shen, et al., "Variability of structural and electronic properties of bulk and monolayer Si2Te3," Applied Physics Letters 109.11 (2016).
Wu, et al. "Morphology control of Si2Te3 nanostructures synthesized by CVD," Journal of Materials Science: Materials in Electronics 29.18 (Apr. 28, 2018).
Keuleyan, et al. "A silicon-based two-dimensional chalcogenide: growth of Si2Te3 nanoribbons and nanoplates," Nano letters 15.4 (2015).
Wu, et al., "Resistive switching in Si2Te3 nanowires," AIP Advances 8.12 (Dec. 2018).
Wu, et al., "Structure and Photoluminescence study of silicon based two dimensional Si2Te3 nanostructures," Journal of Applied Physics 12, 075701-1 (Aug. 17, 2017).

\* cited by examiner

SI2TE3 RESISTIVE MEMORY

This application claims benefit of and priority to U.S. Provisional App. No. 62/747,157, filed Oct. 18, 2018. The complete disclosure, specification, drawings and appendices of U.S. Provisional App. No. 62/747,157 are incorporated herein by specific reference for all purposes.

FIELD OF INVENTION

This invention relates to a resistive memory device fabricated with Si2Te3.

BACKGROUND OF THE INVENTION

In various exemplary embodiments, the present invention comprises a ReRAM device manufactured using 2-D $Si_2Te_3$ (silicon telluride) nanowires, with diameters of tens to hundreds of nanometers, and lengths up to tens of micrometers, synthetized using a chemical vapor deposition (CVD) or vapor-liquid-solid (VLS) process. The $Si_2Te_3$ material, which may be layered, demonstrates a heretofore unknown and surprisingly highly repeatable resistance switching behavior in a silicon-based semiconductor, and stands in contrast to previous oxide-based resistive memory materials. $Si_2Te_3$ is considered as a p-type semiconductor with a band gap in the visible region. It has a unique crystal structure, where Si atoms form dumbbells sandwiched between the Te layers, i.e., Si—Si dimers exist in the sites between the hexagonally close-packed Te atoms. Covalent bonds are formed between the Te and Si within each layer, while weak van der Waals bonding exists between the layers to form a layered crystal structure.

Single-crystalline $Si_2Te_3$ nanowires are synthesized, growing along the c-axis (i.e., along the direction), which is perpendicular to the 2D layers, with stacking of layered nanosheets via the van der Waals force forming unique one-dimensional (1D) structures. In some embodiments, catalysts comprising Au nanoclusters on the substrates play a key role in the nanowire formation. Without the catalysts, instead of nanowires, nano or microplates were obtained. Two-dimensional (2D) materials preferably grow into thin layers and show stacking of the layers due to the van der Waals force, resulting in the formation of a few layers or bulk materials.

The $Si_2Te_3$ nanowires exhibit a unique reversible resistance switching behavior driven by an applied electrical potential, which leads to switching of the NWs from a high-resistance state (HRS) to a low-resistance state (LRS). This switched LRS is highly stable unless the opposite potential is applied to switch the resistance back. This provides a new class of resistive switching based on semiconductor rather than dielectric materials. In several embodiments, the polarity of the initially applied potential along the $Si_2Te_3$ nanowires defines the switch "on" and "off" directions, which become permanent once set. The resistance switching is found to be associated with an internal electrically-induced structural change resulting from the applied potential.

In one embodiment, a single device element comprises two metal electrodes connected to a $Si_2Te_3$ nanowire. The nanowire is initially at high resistance, and is turned to a low resistance state by application of a positive voltage of a few volts to the nanowire. This forms a two terminal memory device with an electrically-driven switching behavior. The fabrication of various memory devices is accomplished through standard microfabrication process.

DETAILED DESCRIPTION OF EXEMPLARY EMBODIMENTS

Memory devices, such as flash memory, are used to serve data and serve as an important component of current information and computing technologies. However, current flash memory devices are approaching their storage density limit due to the reduction in size of transistors to the nano-meter scale range. In various exemplary embodiments, the present invention provides an advancement over the priority art by providing a resistive random access memory (ReRAM) device fabricated with $Si_2Te_3$.

ReRAM is based on the resistance change of materials sandwiched between two electrical terminals or electrodes.

Upon application of an external positive or negative voltage, the resistance can be switched between a low resistance state and a high resistance state (which may referred to as ON and OFF states, respectively, or, in binary terms for data storage, the digits 1 and 0). ReRAM devices offer great benefits over prior art memory devices, including, but not limited to, a simple device structure, high storage density, and fast access speed.

Figure 1:
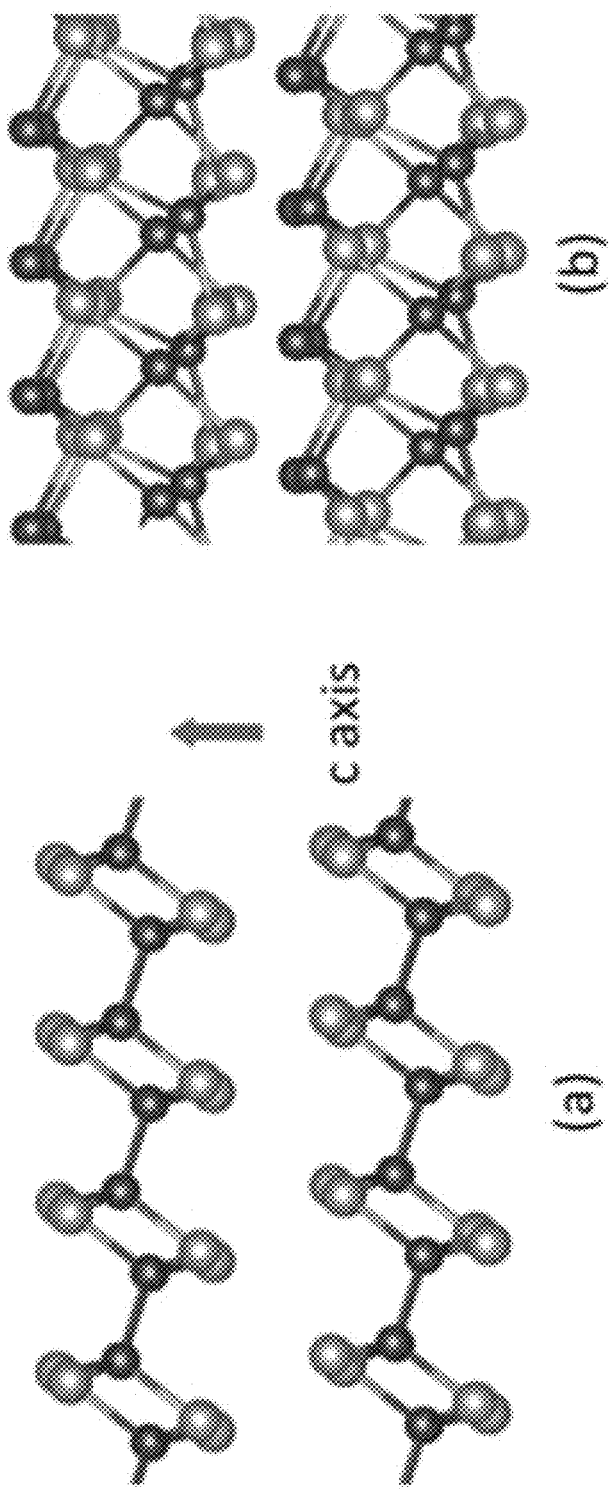
FIG. 1 shows a comparison of the structure of (a) semiconducting $Si_2Te_3$ and (b) metallic $Si_2Te_3$ after restructuring in accordance with an exemplary embodiment of the present invention.
Figure 2:
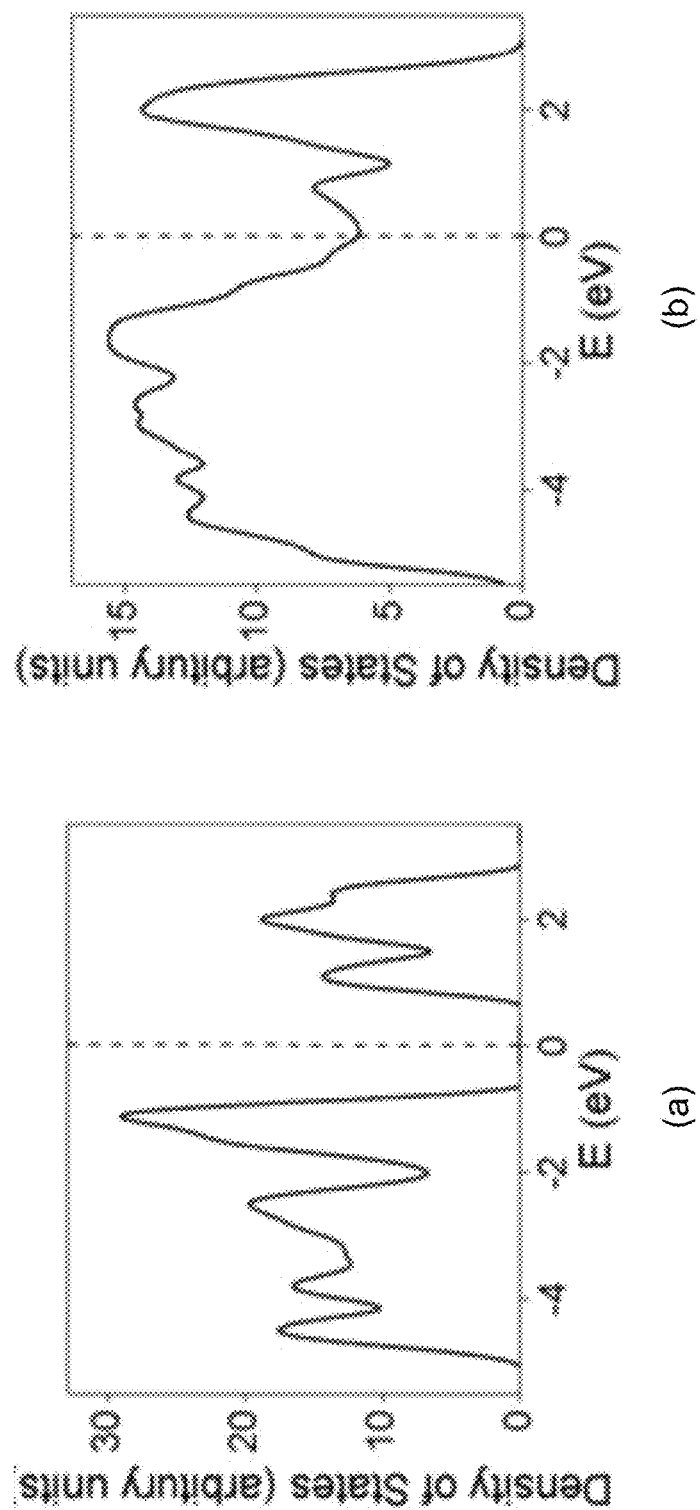
FIG. 2 shows a comparison of the density of states (calculated by density functional theory) for (a) semiconducting $Si_2Te_3$ and (b) metallic $Si_2Te_3$ after restructuring in accordance with an exemplary embodiment of the present invention.

In several embodiments, a ReRAM device in accordance with the present invention is manufactured using 2-D $Si_2Te_3$ (silicon telluride) nanowires (NWs) 10, with diameters of tens to hundreds of nanometers, and lengths up to tens of micrometers, synthetized using a chemical vapor deposition (CVD) or vapor-liquid-solid (VLS) process. The $Si_2Te_3$ material, which may be layered, demonstrates a heretofore unknown and surprisingly highly repeatable resistance switching behavior in a silicon-based semiconductor, and stands in contrast to previous oxide-based resistive memory materials. $Si_2Te_3$ is considered as a p-type semiconductor with a band gap in the visible region. As seen in FIGS. 1-2, it has a unique crystal structure, where Si atoms form dumbbells sandwiched between the Te layers, i.e., Si—Si dimers exist in the sites between the hexagonally close-packed Te atoms. Covalent bonds are formed between the Te and Si within each layer, while weak van der Waals bonding exists between the layers to form a layered crystal structure. Rotation of the Si dimer, with four possible orientations within the $Si_2Te_3$ layer.

As described herein, single-crystalline $Si_2Te_3$ nanowires are successfully synthesized for the first time. The $Si_2Te_3$ nanowires grow along the c-axis (i.e., along the [0001] direction), which is perpendicular to the 2D layers, with stacking of layered nanosheets via the van der Waals force forming unique one-dimensional (1D) structures. In some embodiments, the catalysts comprising Au nanoclusters on the substrates play a key role in the nanowire formation. Without the catalysts, instead of nanowires, nano or microplates were obtained. Two-dimensional (2D) materials preferably grow into thin layers and show stacking of the layers due to the van der Waals force, resulting in the formation of a few layers or bulk materials.

The $Si_2Te_3$ nanowires exhibit a unique reversible resistance switching behavior driven by an applied electrical potential, which leads to switching of sections of the NWs from a high-resistance state (HRS) to a low-resistance state (LRS). This switched LRS is highly stable unless the opposite potential is applied to switch the resistance back. This provides a new class of resistive switching based on semiconductor rather than dielectric materials. In several embodiments, the polarity of the initially applied potential along the $Si_2Te_3$ nanowires defines the switch "on" and "off" directions, which become permanent once set. The resistance switching is found to be associated with an internal electrically-induced structural change resulting from the applied potential (as seen in FIG. 1).

In one embodiment, a single device element comprises two metal electrodes connected to a $Si_2Te_3$ nanowire. The nanowire is initially at high resistance, and is turned to a low resistance state by application of a positive voltage of a few volts to the nanowire. This forms a two terminal memory device with an electrically-driven switching behavior. The fabrication of various memory devices is accomplished through standard microfabrication processes.

The nanowires may be synthesized in a vacuum chamber using tellurium and silicon powders as source material, with nanowire growth on substrates such as, but not limited to, silicon, silicon oxide, or similar materials. The substrates are maintained at approximately 500 to approximately 700 degrees C., while the source materials are heated to the range of approximately 750 to approximately 900 degrees C. Ar or $N_2$ gas is used as the working gas to keep chamber pressure in the mTorr to tens of Torr range. the morphology, composition, and crystal structures of the nanowires may be analyzed using various known techniques (e.g., EDX, SEM, TEM, XPS, XRD, Raman, and the like).

In one exemplary embodiment, Ga is used as an electrode and the conducting substrate on which the $Si_2Te_3$ nanowires are deposited as another electrode. The resistance switch is achievable at room temperature in ambient conditions by sweeping the voltage to a positive or negative value of less than 3 volts. Stability is demonstrated by repeating the voltage sweeping for a large number of cycles.

Single crystal $Si_2Te_3$ nanoplates also may be made using CVD processes. The nanostructures are directly deposited onto Si substrates using vaporized Si and Te powders as source materials. Atomically thin layers of $Si_2Te_3$ may also be mechanically obtained by using an adhesive layer or tape to peel the $Si_2Te_3$ layers off from the CVD micro/nanoplates. Analysis of $Si_2Te_3$ nanoplates using variable temperature photoluminescence demonstrates that the layered 2D $Si_2Te_3$ has a band gap of approximately 2.2 eV.

$Si_2Te_3$ planar nanoplates also show the resistant switching behavior in the similar way as the $Si_2Te_3$ nanowires. $Si_2Te_3$ planar nanostructures with hexagonal shape of tens micrometers size and tens nanometers thick are synthesized by a CVD process.

In one embodiment, a single device element was fabricated by two metal electrodes connected to the top and bottom of the planar nanoplates. The synthesis process of the $Si_2Te_3$ planar nanoplates is similar to that of $Si_2Te_3$ nanowires. They are synthesized in vacuum chamber by using tellurium and silicon powders as source materials. The substrates are kept at 700 to 800 degree C. while the source materials are heated at 800 to 900 degree C. $N_2$ gas is used to keep the chamber pressure in hundreds of Torr range. The mechanical exfoliation process by using a scotch tape can reduce the thickness of planar nanoplates to few nanometers.

An example of synthesis and testing of an embodiment of the present invention is described below. Tellurium (30 mesh, 99.997%) and silicon (325 mesh, 99%) powders are used as source materials for $Si_2Te_3$ NW preparation. Both Te and Si powders were placed in a ceramic crucible and loaded into a high-temperature tube furnace. Au-coated $SiO_2$/Si and Au-coated FTO substrates were placed downstream of the gas flow in a furnace. A quartz tube was first evacuated and then introduced with high purity nitrogen gas to maintain a pressure at 9.12 Torr. The nitrogen flow rate was set at 15 sccm using a mass flow controller. The furnace was then heated to 850° C. at a heating rate of 20° C./min. The growth was allowed for a total of 3 to 5 minutes before cooling down the ceramic crucible and substrates to room temperature.

The morphology of the $Si_2Te_3$ NWs was analyzed using a scanning electron microscope (SEM) and a transmission electron microscope (TEM) with scanning-mode TEM (STEM) imaging and energy-dispersive X-ray (EDX) mapping capabilities. For TEM measurements, the as-grown NWs were mechanically removed from the substrates and redeposited onto copper TEM grids. The crystal structure was characterized by X-ray diffraction (XRD) with Cu Kα radiation (λ=1.54 A). Raman spectroscopy was measured using a DXR Raman microscope with an excitation laser of 532 nm and 2 mW.

The Si$_2$Te$_3$ NWs used for electrical measurements were grown on conducting FTO (fluorine-doped tin oxide) glass substrates. Si$_2$Te$_3$ NWs grown on the edge of the FTO glass were used for electrical study by contacting the NWs with a liquid gallium electrode, while the conducting FTO on which the NWs grow was used as another electrode. A micromanipulator is used to move the gallium electrode and approach the NWs to make electrical contact while the electrical current is monitored. A sudden increase in current provides a signal that physical contact is established between the NWs and the gallium electrode. Note that the liquid gallium is used as an electrode to avoid mechanical damage to the NWs once physical contact is established.

The morphology and crystal structure of the Si$_2$Te$_3$ NWs show diameters ranging from tens to hundreds of nanometers (e.g., 10 nm-900 nm) and lengths of up to 60 μm. Each NW has a very uniform diameter over the whole length scale and is mostly straight with Au at the tip of the nanowires. HRTEM imagery shows the fringes of the Si$_2$Te$_3$ NW, which indicates that the NW is composed of stacked layers packing along the [0001] direction via a weak van der Waals interaction. The periodicity for the alternating fringes along the NW growth direction is 0.65 nm, corresponding to the distance between the (0002) planes for hexagonal Si$_2$Te$_3$. SAED (selected area electron diffraction) patterns also confirm that the growth direction of the NWs is along [0001].

Figure 4:
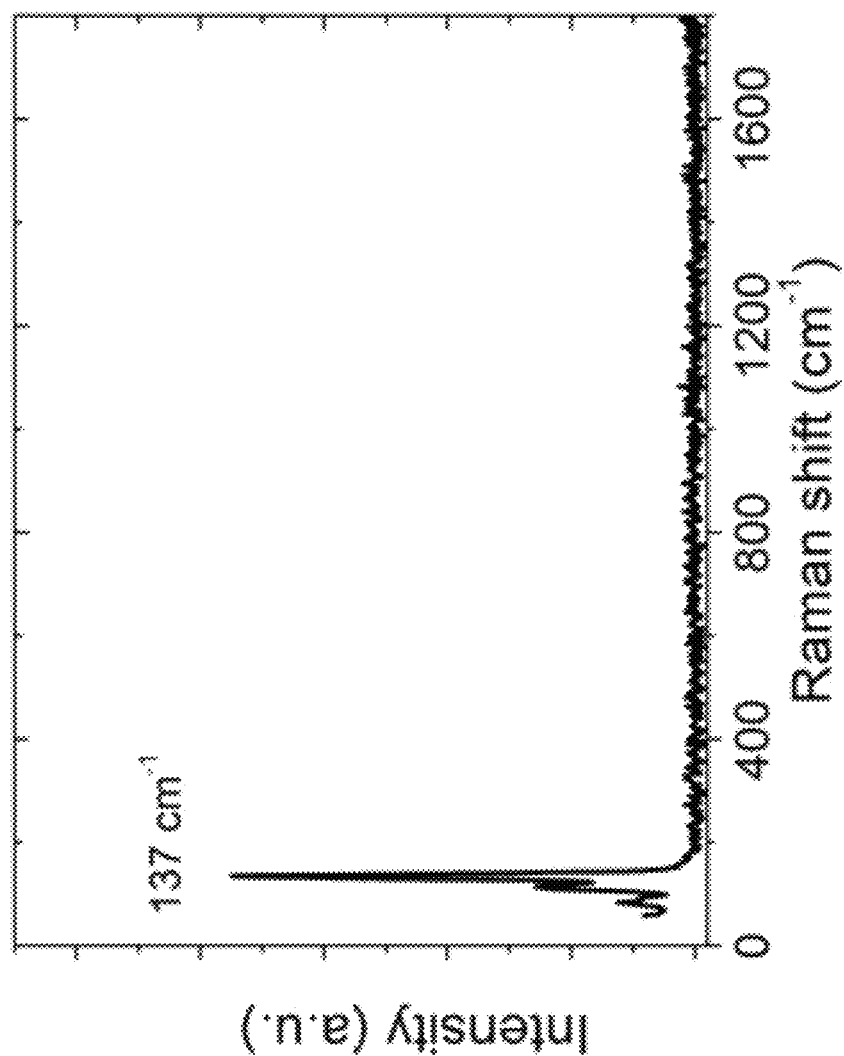
FIG. 4 shows the Raman spectrum for the $Si_2Te_3$ nanowire.
Figure 5:
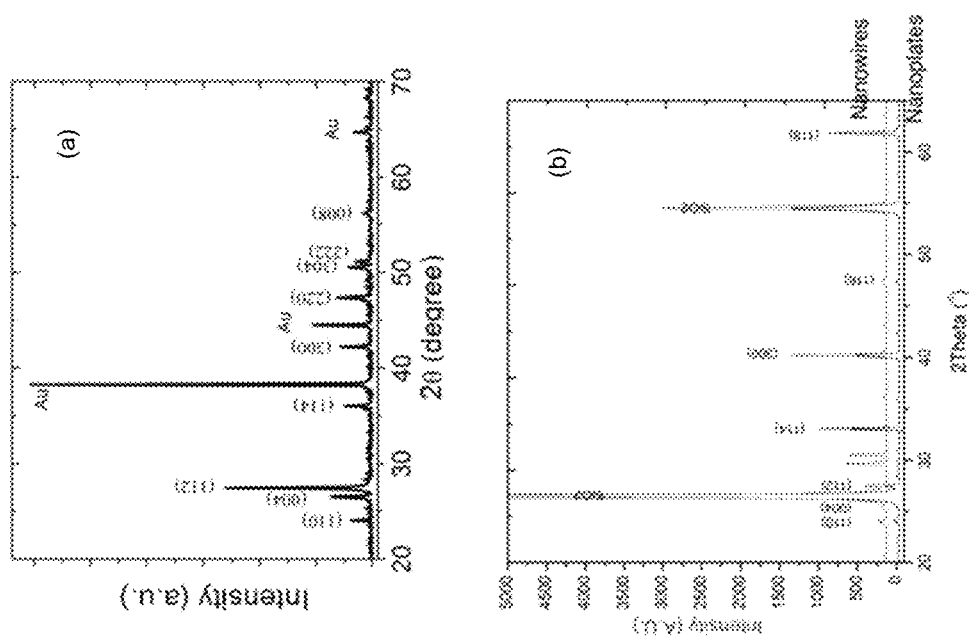
FIG. 5 shows XRD patterns for (a) a $Si_2Te_3$ nanowire, and (b) $Si_2Te_3$ nanoplates and nanowires.

FIG. 4 shows the Raman spectrum for the Si$_2$Te$_3$ NWs. It can be seen that a very strong Raman peak is observed at 137 cm$^{-1}$ for the NWs, which is attributed to A 1 g mode of Si2Te3, as previously observed for nanoplates. The crystal structure is further investigated by XRD, as shown in FIGS. 5(a) (nanowires) and 5(b) (nanowires and nanoplates). Except for several diffraction peaks due to the Au in FIG. 5(a), the rest of the peaks can be indexed to Si$_2$Te$_3$. Rietveld refinement of the XRD spectrum gives lattice constants of $$a=7.422 \text{ Å and } c=13.459 \text{ Å},$$

which is consistent with the parameters for Si$_2$Te$_3$ bulk and nanoplate materials. These data along with the measurements from Raman and TEM/SAED confirm that the nanowires are the 2D material of Si2Te3 with the above-described crystal structure.

Energy-dispersive X-ray spectroscopy (EDX) was measured to determine the NW composition. It was found that the NWs show an elemental ratio of 2:3 for Si and Te, which confirms that the NWs have the chemical formula Si$_2$Te$_3$. The elemental composition was also measured by X-ray photoemission spectroscopy. Local elemental mapping for the individual Si$_2$Te$_3$ NWs by EDX was carried out to probe composition variations across the nanowires.

The EDX mapping was taken on the tip of the NW, which demonstrates the uniformity of the Si:Te elemental ratio across the entire nanowire. Au was found only at the tip of the nanowire.

Figure 6:
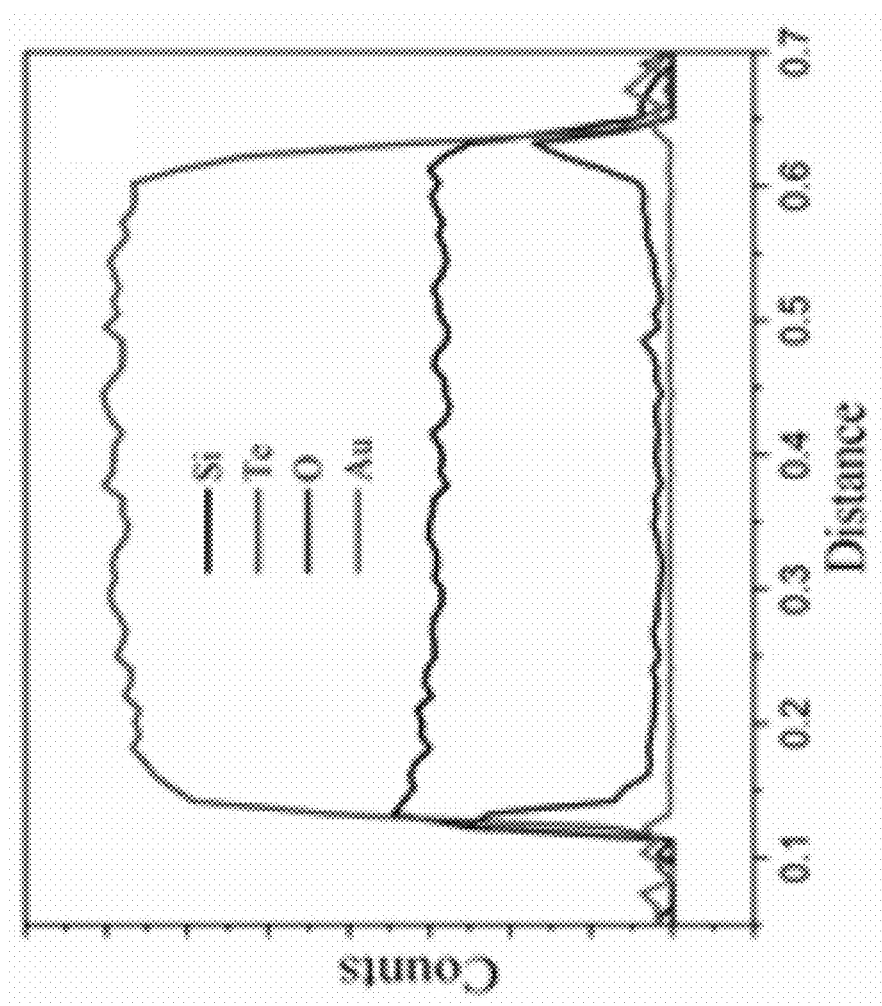
FIG. 6 shows the EDX cross-section elemental line scan across a $Si_2Te_3$ nanowire.

Both Si and Te are uniformly distributed across the nanowire. The EDX elemental line scans across the NW, as shown in FIG. 6, do not reveal a variation for the Si and Te elemental distribution within the nanowire. It is also noted that the O element exists on the surface of the nanowire. This is because the Si$_2$Te$_3$ has pronounced hygroscopic properties and its surface can easily react with water vapor when exposed to air. The line scan across the nanowire shows higher counts near the surface, confirming that the O is mainly found on the surface of the nanowire.

EDX mapping shows that the interface between the Au cluster and Si$_2$Te$_3$ nanowire is extremely flat, indicating layer-by-layer growth at the interface. This observation is very interesting because of the formation of 2D materials in a 1D form. These nanowires are formed due to accelerated growth along the [0001] direction as a result of the Au catalyst. Without the catalyst, only Si$_2$Te$_3$ nanoplates were obtained. The growth mechanism for the NWs is similar to the VLS growth process described above. The Te and Si vapors are transported to the substrate surface held at 600° C. to form Si$_2$Te$_3$ NWs due to the presence of the catalyst in the form of Au droplets. The growth is limited to one dimension, with a diameter similar to the size of the Au droplets since the Au accelerates the growth of Si$_2$Te$_3$ layers along the [0001] direction. Under similar conditions and growth times, the nanowires grown using catalysts have lengths of up to 100 micrometers, while the nanoplates have a thickness (dimension along the [0001] direction) of only approximately 200 nanometers. The catalysts promote the growth along the [0001] direction by up to 1000 times, which results in the formation of nanowires. The diameter of the nanowires is determined by the size of the catalytic Au droplets.

To facilitate electrical characterization without breaking the nanowires, liquid Gallium was used as one electrode to avoid mechanical damage. The conducting substrate on which the nanowires were grown was used as another electrode and was suspended above the stage along with a gallium electrode. To make contact between the Si$_2$Te$_3$ NWs and the liquid Ga, the stage is lifted up using a precise micromanipulator, while the current is monitored under a constant voltage. One can tell when an NW is in contact with the Ga electrode from the observation of an abrupt increase in the current from zero.

Figure 7:
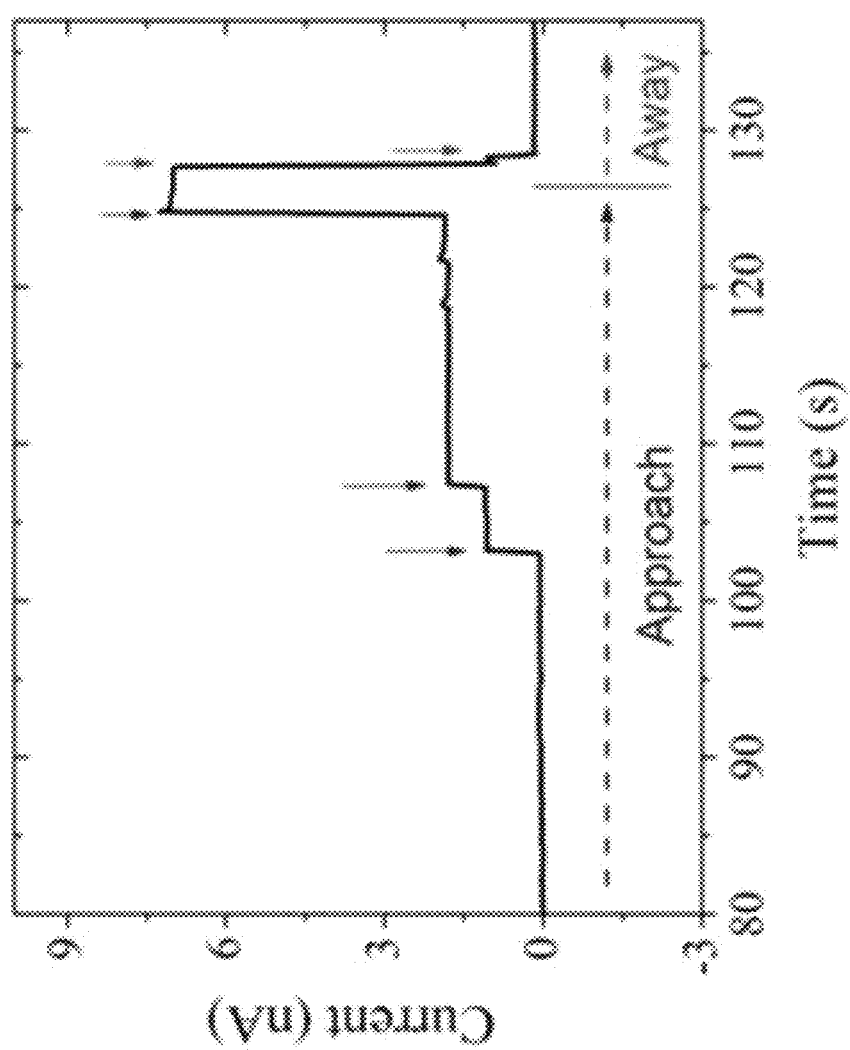
FIG. 7 shows the variation in current for a $Si_2Te_3$ nanowire under an applied voltage of 0.1 V as a gallium electrode is moved toward and aware from the $Si_2Te_3$ nanowire.
Figure 8:
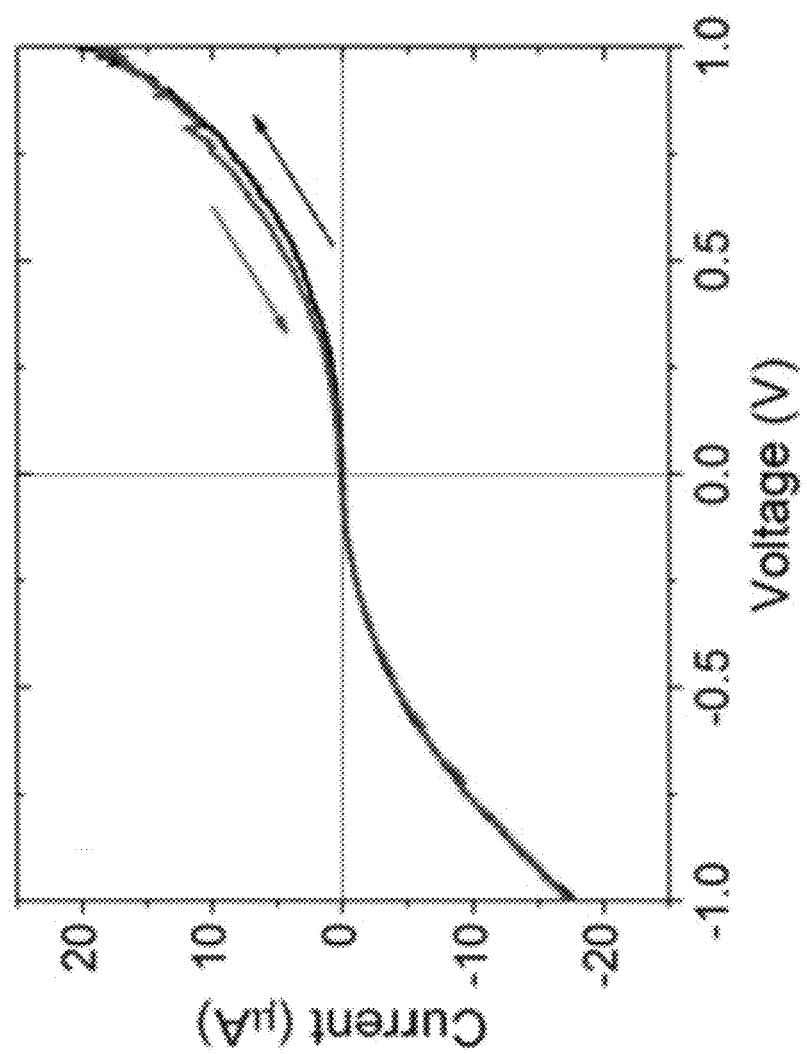
FIG. 8 shows the I-V curve measured between −1 and +1 V for the $Si_2Te_3$ nanowire of FIG. 7 after contact by the gallium electrode is established.

FIG. 7 shows the current change with time measured under a constant voltage of 0.1 V for an NW moving towards the Ga electrode. The initial current is zero because there is no contact between the NWs and Ga electrode. As the Ga electrode approaches the Si$_2$Te$_3$ NWs, the current jumps from 0 to approximately 0.9 mA at 103 seconds, indicating that a nanowire is contacted with the Ga electrode. If one continues to move the Ga electrode toward the NW sample, the current stays constant until a second current jump from 0.9 to 1.8 mA is observed at approximately 107 seconds due to additional NW contact with the Ga electrode. Further moving of the Ga electrode closer to the NW sample leads to the observation of a large jump in the current of up to 7 mA, which may be caused by a large wire or a group of NWs contacting with the Ga electrode. As the stage with the Ga electrode moved away from the NWs, the current suddenly drops to 0.9 mA and further to zero. This confirms that it is possible to make electrical contact with the NWs using a liquid electrode and measure the current-voltage (I-V) curve for individual Si$_2$Te$_3$ NWs.

Once contact with the NWs by the Ga electrode is established, an I-V curve can be measured. A nonlinear characteristic is observed, because the as-prepared Si$_2$Te$_3$ is a semiconductor and an energy barrier may be formed at the metal-NW contact. In the low voltage range between −1 and 1 V, the I-V curve is repeatable when sweeping the voltage back and forth. In various embodiments, the current for the individual NWs may vary due to their different diameters.

Figure 9:
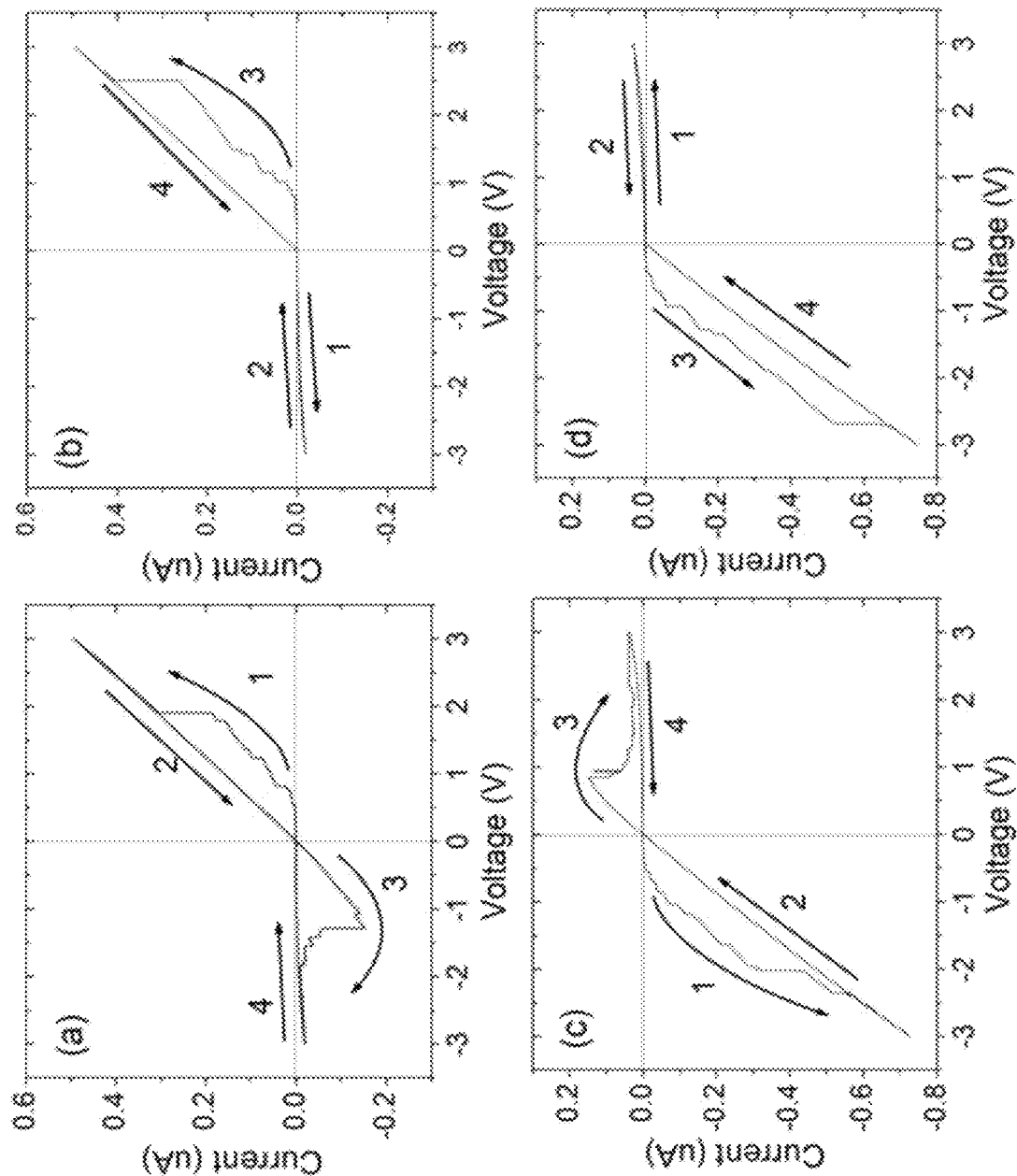
FIG. 9 shows resistance switching behavior for two $Si_2Te_3$ nanowires, one with initial polarization using a positive voltage (a, b), and a second with initial polarization using a negative voltage (c, d). The positive voltage refers to the potential on FTO electrode. The voltage sweep sequences are indicated in the figures by arrows 1-4.

As shown in FIG. 9(a), resistance switching is observed in a freshly prepared Si$_2$Te$_3$ NW as the voltage was increased from 0 V, with a current jump at approximately 0.9 V. This sudden current jump from low to high corresponds to a sudden drop in resistance at the applied voltage. This process is referred to as SET for switching a low-resistance state (LRS) to a high-resistance state (HRS). If one continues to increase the voltage, a few current jumps occur at different voltages. When the voltage sweeps back from +3.0 to −3.0 V, the LRS is initially preserved until a negative voltage of −1.1 V is applied. The original HRS is restored after a few current drops. This resistance switching from LRS to HRS is referred to as a RESET process. Further scanning of the voltage from −3.0 to 0 V does not change the resistance of the NW, which is actually the original resistance before the SET process.

This current switching behavior is repeatable as long as the voltage scan sequence (from 0 to 3 V, then back to 0, −3, and then 0 V) is unchanged, i.e., from 1 to 2, 3 and 4, as labelled in FIG. 9(a). The SET process from the HRS to LRS always occurs at an applied positive voltage, and the RESET always occurs from the LRS to HRS at a negative voltage. If an opposite voltage scan sequence is used, as shown in FIG. 9(b) (but after the initial application of the positive applied voltage of FIG. 9(a)), the NWs remain in the HRS at the negative voltage range, and the SET still occurs once a positive voltage is applied. Therefore, the SET process occurs only at an applied positive voltage, while the RESET process only occurs at negative voltage. The switching behavior is not symmetric. The occurrence voltage for the SET and RESET processes is associated with the initial polarity of the voltage applied to a freshly prepared NW.

FIG. 9(c) shows the I-V curve obtained for another fresh $Si_2Te_3$ NW, which was measured by applying an initial voltage ranging from 0 to a negative value (i.e., the initial polarization is opposite to that applied to the NW of FIG. 9(a)). In this sequence, the first SET process occurs at −0.6 V followed by a few more current switching events at more negative voltage. As the voltage scans back from −3.0 V to 0 V, the LRS stays unchanged. Then, once a positive voltage is applied, the RESET process occurs at approximately 0.9 V. It takes a few steps for the NWs to complete the RESET process (i.e., back to its original resistance). After RESET, the NWs remain in the HRS when the voltage is scanned from 3.0 to 0 V. Experiments were also carried out by starting the voltage scan from zero to +3.0 V first for this already initiated sample; for this sample, no current switching using an applied positive voltage was observed, but switching does occur for an applied negative voltage, as shown in FIG. 9(d). This demonstrates that the SET from the HRS to LRS occurs only at negative voltage, while the RESET occurs only at positive voltage, which is different from the above-described sample shown in FIGS. 9(a) and 9(b).

The experimental data clearly indicates that the SET and RESET conditions for the two samples are different. Each one has its own polarity for the resistance switching. Analysis of a large number of samples demonstrates that the initial voltage scan (i.e., initial applied potential) for a fresh (i.e., not previously subject to an applied voltage/potential) sample determines it SET and RESET to occur at either positive or negative voltage. If the first scan starts from 0 to positive voltage, a SET process from the HRS to LRS is programmed to occur at positive voltage. The NWs permanently inherit the SET at positive voltage and RESET at negative voltage sequence. However, if the initial applied voltage ranges from 0 to a negative value for the SET process, then the device shows a SET at negative voltage and a RESET at positive voltage. Therefore, the polarity of the voltage applied to a freshly prepared NW for inducing resistance switching for the first time permanently defines the SET and RESET conditions in the NW. This initial applied voltage for switching is believed to cause a permanent change in the NWs, which is difficult to completely reverse afterwards.

Figure 10:
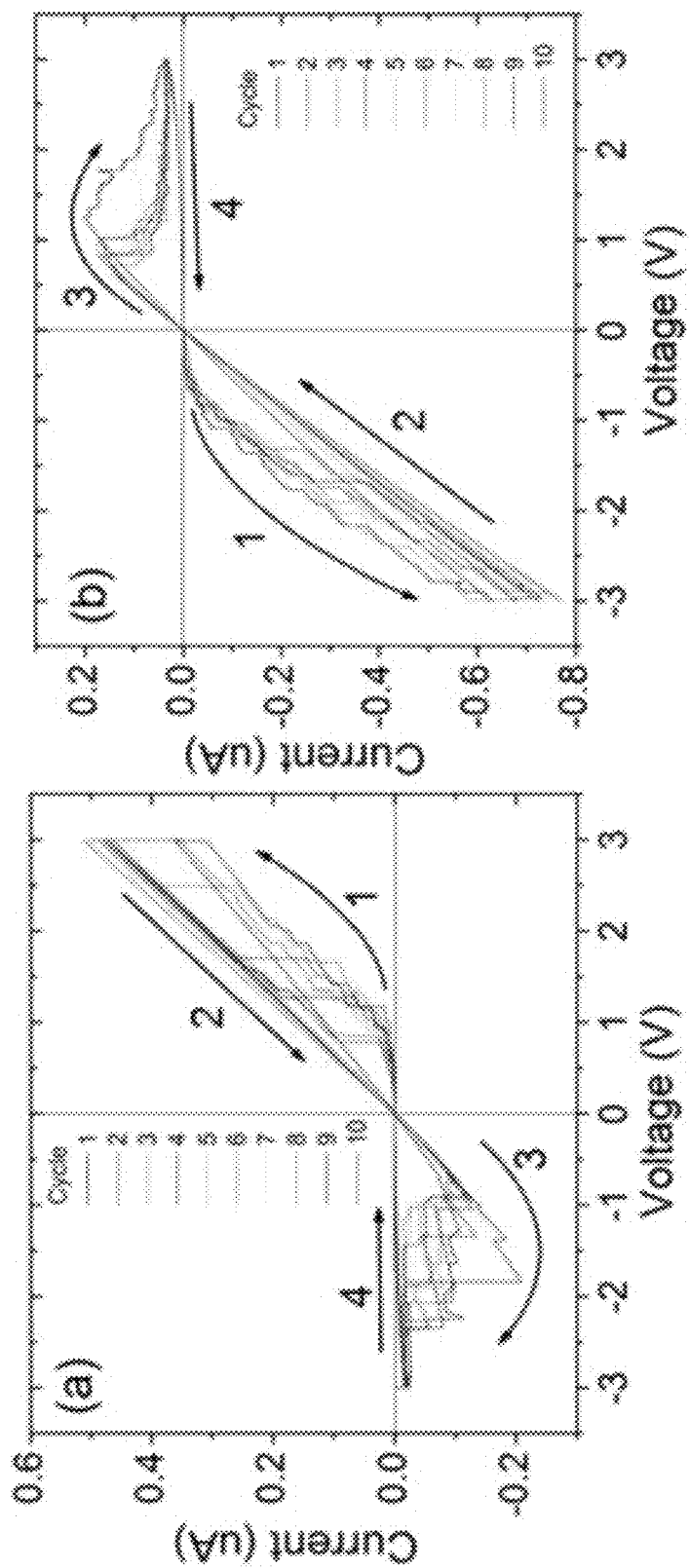
FIG. 10 shows repeated resistance switching under multiple scans (cycles) for positive (a) and negative (b) polarized $Si_2Te_3$ nanowires. The voltage sweep sequences are indicated in the figures by arrows 1-4.
Figure 11:
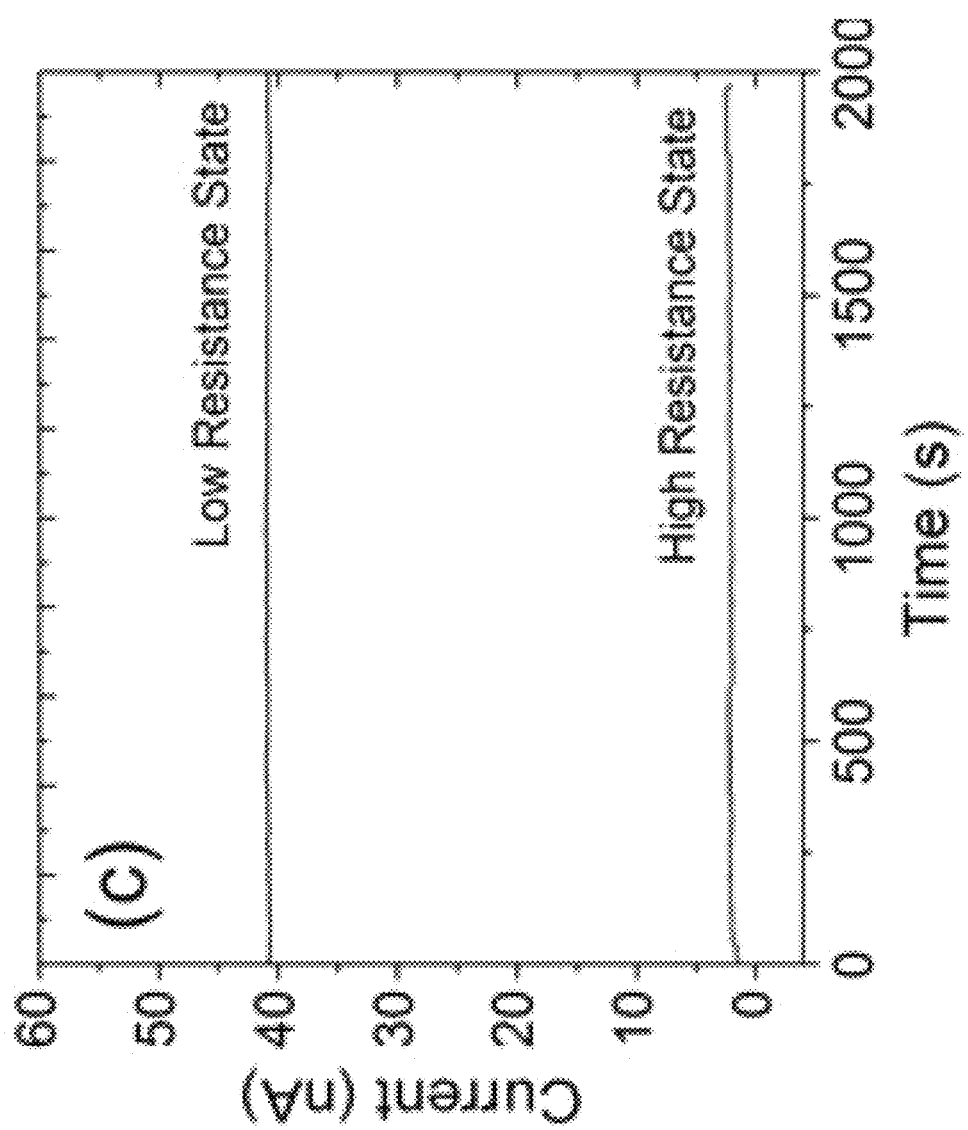
FIG. 11 shows a stability test for $Si_2Te_3$ nanowire devices in the high and low resistance states with an applied constant voltage of 100 mV.

The resistance switching behavior is repeatable for individual NWs as well as a large number of NW samples. FIGS. 10(a) and (b) show repeated SET and RESET for resistance switching for two types of "programmed" NWs using different polarities for the initial voltage. Each experiment is carried out by scanning the voltage for 10 cycles. Although the voltages at which the SET and RESET occur are slightly different from one cycle to another, the overall switching behavior is well-reproduced each time. FIG. 11 shows the stability of the NWs in the HRS and LRS states by monitoring the current under a constant voltage of 0.1 V over time. The current in both states is extremely stable without a noticeable change observed over 2000 s. This highly stable resistance switching behavior provides for use of the $Si_2Te_3$ in memristors and ReRAM devices.

Figure 3:
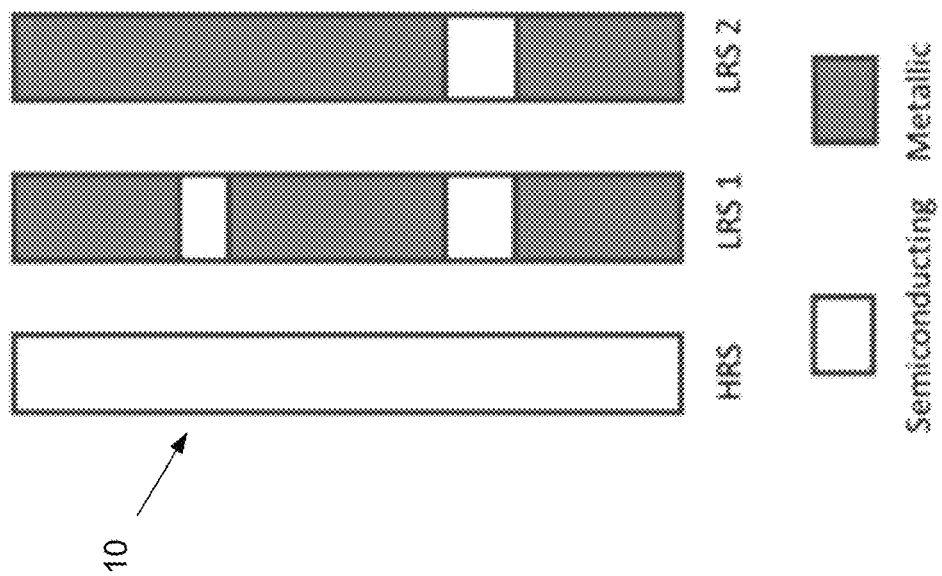
FIG. 3 shows examples of switching from the high-resistance state (HRS) to multiple low-resistance states (LRSs) in different sections of the nanowire, wherein in HRS the $Si_2Te_3$ has a semiconducting structure and in LRS the $Si_2Te_3$ has a metallic structure.

The resistance switching behavior in the $Si_2Te_3$ NWs cannot be explained by a crystalline to amorphous phase change, as such a mechanism is usually unipolar rather than bipolar. It is also unlikely due to the formation/rupture of nanoscale metal filaments, as no mobile metal ions such as Ag are present. The contact effect is also excluded because the switching behavior is independent of electrode materials as being used in this study. Based on the results obtained, the resistive switching in $Si_2Te_3$ NWs originates from a unique phase transition: when an external voltage is applied along the NWs, the Si—Si dimers in $Si_2Te_3$ dissociate under the effect of Joule heating, with one of the two Si atoms in the dimer migrating across the top of the Te bilayer under the electric field, causing the $Si_2Te_3$ to restructure into a metastable metallic phase (FIG. 1). A structural optimization of the model for restructured $Si_2Te_3$ using density functional theory indicates the structure is indeed metastable. This is supported by the calculated electronic density of states for the restructured phase, which shows a metallic feature compared to the original semiconducting $Si_2Te_3$ phase (FIG. 2). Therefore, the restructuring shown in FIG. 1 can explain the resistive switching in $Si_2Te_3$ NWs. This switching mechanism explains the bipolar switching behavior because an opposite voltage is required to move the migrated Si atom back to its original position. This mechanism also explains the multiple resistance states observed for the NWs during switching because restructuring can occur in different segments of the NWs instead of the whole NW, as illustrated in FIG. 3.

This mechanism is also further supported by the experimental data obtained for the number of SET and RESET steps. When only one SET occurs (i.e., one resistance switching), only one recovering step is needed. This corresponds to one segment of nanowires being switched. As the number of SET steps increases, i.e., more segments participate in the transition from semiconducting to metallic, the RESET process also requires more RESET steps of the same number to switch the NWs back to their original state. This observation agrees well with the proposed mechanism that involves switching of the different segments of the NWs, as shown in FIG. 3.

It should be noted that the as-fabricated NWs show symmetric switching, as the first SET process can occur under either positive or negative voltages. However, after the first SET, the polarity of the NW is fixed. This phenomenon can be understood by the fact after the first SET and RESET, not all atoms of the restructured metallic $Si_2Te_3$ are switched back to the original position. The metallic phase of the $Si_2Te_3$ shows a permanent electrical dipole moment due to the asymmetric distribution of Si and Te along the c-axis (FIG. 6b), and the parts of the NW that have not switched back to the semiconducting phase will show an electrical dipole moment in the same direction as the first SET voltage. If one attempted to SET the NWs using the opposite voltage, the remaining electrical dipole moments will cancel the external electric field and prevent the SET process.

Single-crystalline $Si_2Te_3$ nanowires thus are grown by using a vapor-liquid-solid process with the assistance of a gold catalyst. The $Si_2Te_3$ nanowires show layer-by-layer growth along the direction, i.e., layer by layer stacking along the nanowire axis. The resistance of the nanowires can be reversibly switched between high or low resistance states by applying an electric potential, which demonstrates that the $Si_2Te_3$ nanowires are a promising candidate for resistive memory devices. The polarity of the bipolar switching can be "programmed" by the polarity of the initial voltage applied to a freshly prepared nanowire. The resistance switching behavior is explained by a phase transition between metallic and semiconducting segments along the nanowires.

Figure 12:
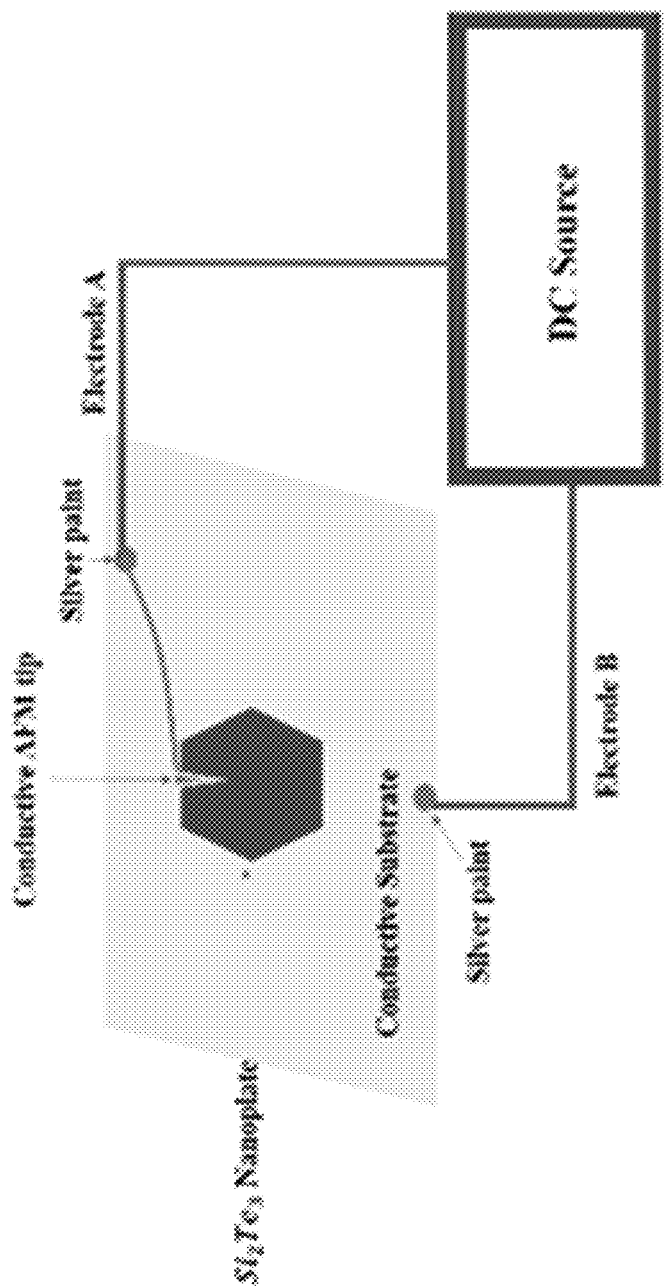
FIG. 12 shows a diagram of I-V measurement of a $Si_2Te_3$ nanoplate using an AFM tip.
Figure 13:
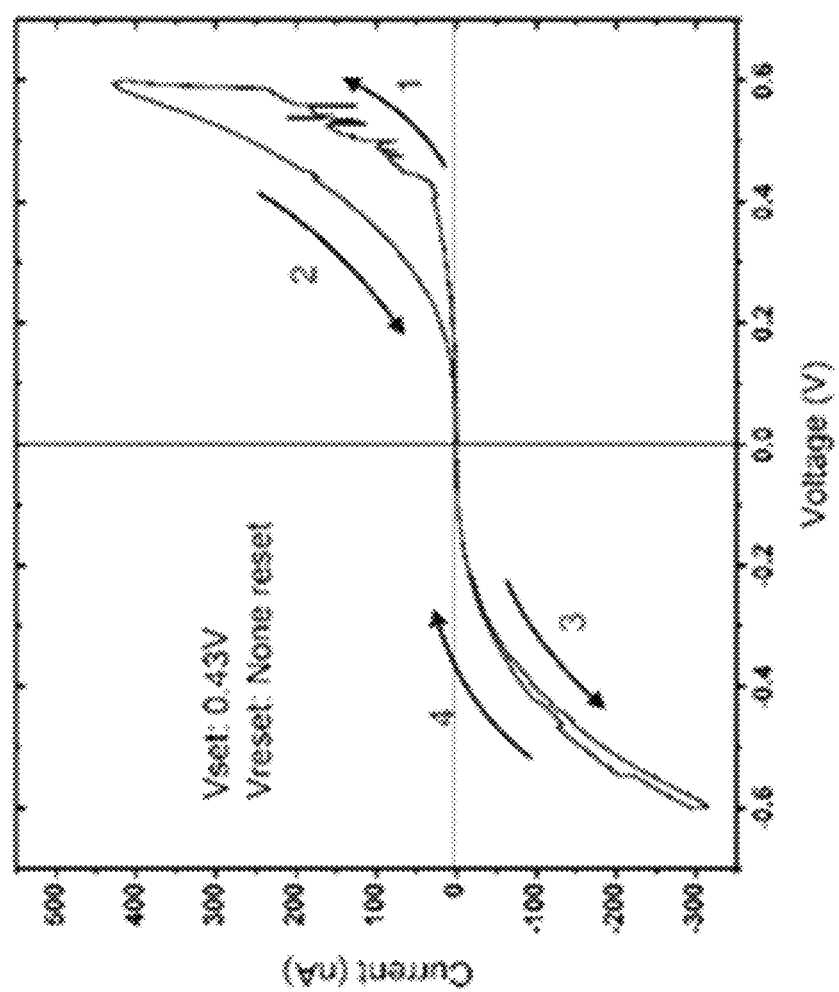
FIG. 13 shows an I-V curve of a single $Si_2Te_3$ planar nanoplate from FIG. 12.
Figure 14:
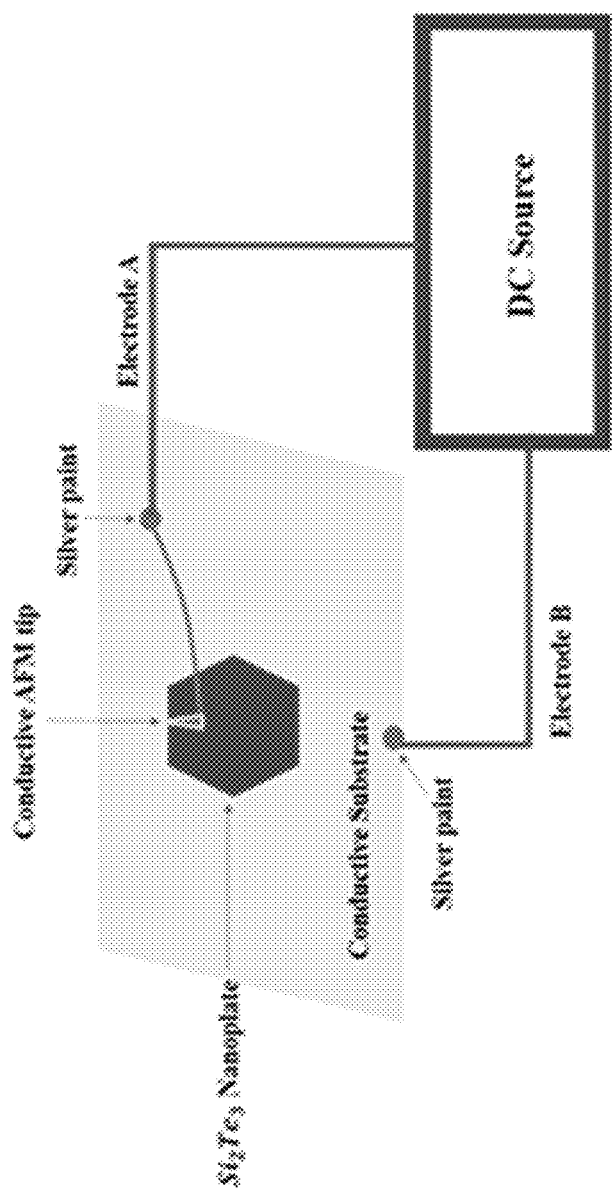
FIG. 14 shows a diagram of I-V measurement of a $Si_2Te_3$ nanoplate using the back side of an AFM tip.
Figure 15:
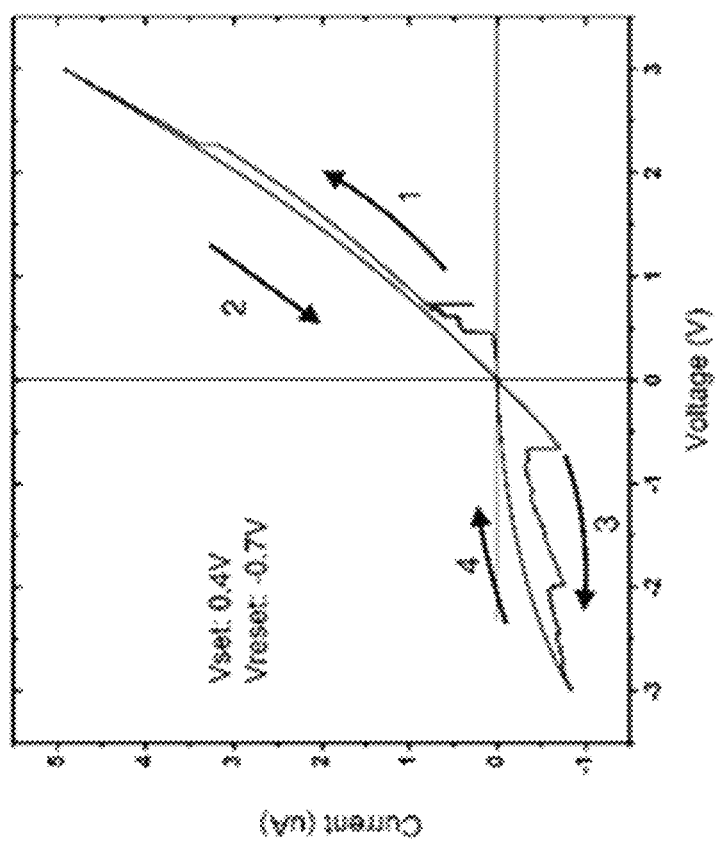
FIG. 15 shows an I-V curve of a single $Si_2Te_3$ planar nanoplate from FIG. 14.

In another example, $Si_2Te_3$ nanoplates are grown on a highly doped N-type Si substrate. A conductive contact mode atomic force microscope (AFM) is used to apply the voltage to a single $Si_2Te_3$ planar nanoplate for resistive switching study. Two types of configuration are used for electrical measurement. In the first configuration, the cantilever of the AFM, which has a tip diameter of 10 nm, is brought in contact with the NPs (see FIG. 12). Due to the small size of the probe tip, the voltage in this configuration is limited to 0.6 V to prevent overheating. The I-V curve shows the resistant switching from high resistant state to low resistant state (see FIG. 13). In the second configuration, the AFM tip is flipped so that the back side of the cantilever beam with size of 40 um, is in contact with the NP (see FIG. 14). With this large contact area, the maximum voltage up to 3 V can be applied. Stable resistive switching behavior is observed as shown in FIG. 15.

In several additional embodiments, the active resistive switching material may comprise silicon telluride nanoparticles and/or films, in addition to or in place of the above-described nanowires and nanoplates. While the composition of the material is discussed herein as $Si_2Te_3$, the composition may comprise $Si_xTe_y$, where x and y are any positive integer or number. Deposition processes may include chemical vapor deposition, physical vapor deposition, or vapor-liquid-sold processes, typically on a substrate. Catalysts used on or in combination with the substrate may include Au, Ag, or other metal nanoclusters, nanoparticles, or films.

These embodiments, as well as other exemplary embodiments, as well as the tools and programs referenced above, are fully described in detail in the appendices attached to the provisional application, which are incorporated herein in their entireties by specific reference for all purposes. Thus, it should be understood that the embodiments and examples described herein have been chosen and described in order to best illustrate the principles of the invention and its practical applications to thereby enable one of ordinary skill in the art to best utilize the invention in various embodiments and with various modifications as are suited for particular uses contemplated. Even though specific embodiments of this invention have been described, they are not to be taken as exhaustive. There are several variations that will be apparent to those skilled in the art.

What is claimed is:

1. A memory device, comprising:
a silicon telluride (Si2Te3) nanowire disposed between a first electrode and a second electrode, wherein the silicon telluride (Si2Te3) nanowire switches between a high resistance state and a low resistance state under an applied potential;
wherein the silicon telluride (Si2Te3) nanowire comprises a nanowire manufactured by chemical vapor deposition on a substrate with one or more catalysts on the substrate, said one or more catalysts comprising Au nanoclusters.

2. The memory device of claim 1, wherein the applied potential causes structural change in the silicon telluride (Si2Te3) nanowires.

3. The memory device of claim 1, wherein the low resistance state is highly stable.

4. The memory device of claim 1, wherein the device is switched from a high resistance state to a low resistance state by application of the applied potential with a first polarity.

5. The memory device of claim 4, wherein the device is switched from a low resistance state to a high resistance state by changing the first polarity of the applied potential to a second polarity opposite the first polarity.

6. The memory device of claim 1, wherein the device is switched from a low resistance state to a high resistance state, or vice-versa, by the applied potential without changing polarity.

7. The memory device of claim 1, wherein the memory device is a flash memory device.

8. The memory device of claim 1, wherein the memory device is a memristor.

9. The memory device of claim 1, wherein the applied potential when first applied has a polarity that permanently defines the switch directions for low resistance state and high resistance state for a particular silicon telluride (Si2Te3) nanowire.

* * * * *